(12) United States Patent
Wong

(10) Patent No.: US 7,099,188 B1
(45) Date of Patent: Aug. 29, 2006

(54) BIT LINE REFERENCE CIRCUITS FOR BINARY AND MULTIPLE-BIT-PER-CELL MEMORIES

(75) Inventor: Sau Ching Wong, Hillsborough, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/151,863

(22) Filed: Jun. 13, 2005

Related U.S. Application Data

(62) Division of application No. 10/173,468, filed on Jun. 14, 2002, now Pat. No. 6,906,951.

(60) Provisional application No. 60/298,422, filed on Jun. 14, 2001.

(51) Int. Cl.
*G11C 16/04* (2006.01)
*G11C 16/06* (2006.01)
*G11C 7/06* (2006.01)
*G11C 5/14* (2006.01)
*G11C 7/00* (2006.01)
*G11C 7/02* (2006.01)

(52) U.S. Cl. .............. 365/185.03; 365/185.11; 365/185.21; 365/185.25; 365/189.07; 365/189.09; 365/189.11; 365/207

(58) Field of Classification Search .......... 365/189.09, 365/189.11, 189.07, 207, 210
See application file for complete search history.

(56) References Cited

U.S. PATENT DOCUMENTS

| 4,879,682 | A | | 11/1989 | Engles | |
|---|---|---|---|---|---|
| 5,117,394 | A | | 5/1992 | Amin et al. | |
| 5,638,320 | A | * | 6/1997 | Wong et al. | ............ 365/185.03 |
| 5,650,656 | A | | 7/1997 | Iwahashi | |
| 5,675,537 | A | * | 10/1997 | Bill et al. | .............. 365/185.22 |
| 5,703,820 | A | | 12/1997 | Kohno | |
| 5,751,635 | A | * | 5/1998 | Wong et al. | ............ 365/185.19 |
| 5,754,475 | A | | 5/1998 | Bill et al. | |
| 6,097,633 | A | | 8/2000 | La Placa | |
| 6,118,702 | A | | 9/2000 | Shieh et al. | |
| 6,236,588 | B1 | | 5/2001 | Koo | |
| 6,359,821 | B1 | | 3/2002 | Roohparvar | |
| 6,490,203 | B1 | | 12/2002 | Tang | |
| 6,507,525 | B1 | | 1/2003 | Nobunaga et al. | |
| 6,751,124 | B1 | | 6/2004 | Lee | |
| 2003/0026144 | A1 | | 2/2003 | Lee | |

* cited by examiner

*Primary Examiner*—Amir Zarabian
*Assistant Examiner*—Ly Duy Pham
(74) *Attorney, Agent, or Firm*—Volentine Francos & Whitt

(57) ABSTRACT

Auto-tracking bit line reference schemes have common reference and normal word lines and generate a "½ cell current" reference by providing reference bit lines with pull-up devices having a different effective size from the pull-up devices for bit line or by programming reference cells to different levels. To provide a true "current mirror" connection of the pull-up devices of bit line and one or more reference bit lines, an additional bias bit line causes currents through the pull-up devices for the selected bit line and the reference bit lines to mirror current through the pull-up device for the bias bit line. Embodiments of the invention can be used with binary and multiple-bit-per cell memory and with a variety of sense amplifiers, memory array architectures, and memory cell structures.

13 Claims, 13 Drawing Sheets

BIT LINE REFERENCE CIRCUITS FOR BINARY AND MULTIPLE-BIT-PER-CELL MEMORIES

CROSS-REFERENCE TO RELATED APPLICATONS

This patent document is a divisional and claims benefit of the priority date of U.S. patent application Ser. No. 10/173, 468, filed Jun. 14, 2002 now U.S. Pat. No. 6,906,951, which claims benefit of the earlier filing date of U.S. provisional patent application 60/298,422, filed Jun. 14, 2001, both of which are hereby incorporated by reference in their entirety.

BACKGROUND

Sensing operations, which read or otherwise determine the states of memory cells in semiconductor memory devices, often use a reference signal and generate a data value depending on the relation of a bit line signal to the reference signal. The bit line signal generally depends on a current through or from a memory cell connected to the bit line and is subject to variations in the performance of the memory cell. Such performance variations may arise from variations in the fabrication process for the memory, the temperature or other operating conditions, the endurance or cycling history, the age of the memory cell, or the lapsed time since data was written to the memory cell. The reference signal preferably tracks these performance variations of the memory cell so that sensing operations provide consistent results, i.e., output the same data value, despite the variations.

FIG. 1 illustrates a conventional bit line reference scheme for a conventional Flash memory array 100 using a single-ended sense amplifier 150. Flash memory array 100 has a separate bank 110 of reference cells 115 that are substantially identical to and operate in the same manner as memory cells 125 in a bank 120. Reference memory cells 115, in this example, are set at an "erased" or "low" threshold voltage (Vt) state.

FIG. 1 shows memory cells 125 and reference memory cells 115 sharing the same word lines WL1 to WLn and word line drivers 140. In general, using the same word lines for memory and reference cells provides better tracking of gate or word line voltages and eliminates the need for separate reference word line decoders and drivers and associated redundancy circuits. In a standby mode of memory array 100, all word lines WL1 to WLn are grounded to turn off all memory cells 125 so that little or no bit line current flows, and single-ended sense amplifier 150 (and its output signal SAout) are set to a state that corresponds to reading a "programmed" or "high Vt" memory cell.

For a sensing operation, a selected word line driver 140 activates a selected word line. As a result, an activated reference cell 115 provides a reference current on a reference bit line BLref. The reference current is preferably about equal to the normal cell current through a virgin or low Vt memory cell in memory array 120. Selected memory cells 125 that are connected to the activated word line conduct or not depending upon the threshold voltage states of the memory cells.

P-channel pull-up devices 131 and 132 connected in a "current-mirror" configuration mirror the reference current from reference bit line BLref to bit lines BLm. As a result, the ratio of the sizes of P-channel pull-up devices 131 and 132 determines the percentage of the normal cell current that a selected memory cell 125 must conduct to trip the corresponding sense amplifier 150. Typically, this ratio ranges from about 2:1 to 4:1, (e.g., W1/L1 is between 2W2/L2 and 4W2/L2, where transistor 131 has channel width W1 and channel length L1 and transistor 132 has channel width W2 and channel length L2. If the ratio is 4:1, and if the normal cell current through a virgin or low Vt reference cell is 40 µA, the selected memory cell must conduct more than 10 µA to trip single-ended sense amplifier 150, causing output signal SAout to represent the data value "1." Accordingly, a virgin or low Vt memory cell, which conducts a current greater than 10 µA will trip single-ended sense amplifier 150, but a programmed memory cell, which conducts a current less than 10 µA, does not trip sense amplifier 150, causing output signal SAout to represent the data value "0."

FIG. 2 shows a contactless buried diffusion memory array 200 implementing a sensing operation that uses a reference signal and single-ended sense amplifier 150 in the same manner as described above for memory array 100 of FIG. 1. Memory array 200 has a bank 210 of reference cells 215, a bank 220 of memory cells 225, and bit line pull-up devices 131 and 132. In particular, the activated reference cell 215 conducts a reference current on reference bit line BLref that is about equal to the normal current through a virgin or low Vt memory cell, and bit line pull-up devices 131 and 132 mirror the reference current to bit lines BLm. Single-ended sense amplifiers 150, which are connected to the bit lines BLm, will trip or not depending on whether or not selected memory cells 225 conduct a current greater than the mirrored current.

FIG. 3 illustrates a conventional Flash memory array 300 implementing a conventional bit line reference scheme for a sense amplifier 350 having differential inputs. In memory array 300, reference cells 115 in separate reference bank provides a reference-current approximately equal to a "½ cell reference current", which is about half-way between the current through a memory cell in the erased or low Vt state and a "zero cell current" through a memory cell 125 in the programmed or high Vt state. Memory array 300 uses two P-channel bit line pull-up devices 331 and 332 that differ from devices 131 and 132 of FIG. 1 in that devices 331 and 332 have approximately the same sizes and are not connected to form a current-mirror. Additionally, a common Vbias voltage, which can be a reference voltage having a voltage level lower than Vcc minus the threshold voltage Vtp of a pull-up device, controls P-channel bit line pull-up devices 331 and 332. Accordingly, in memory array 300, bit line pull-up devices 331 and 332 conduct the same or nearly the same amount of current.

A voltage difference that develops between bit line BLm and reference bit line BLref is positive or negative depending on whether the selected memory cell 125 conducts less or more current than the selected reference cell 115 conducts. Differential sense amplifier 350 can sense a small voltage difference that develops between the I/O and I/O reference lines that are connected to the selected bit line BLm and the reference bit line BLref. Sense amplifiers 350 with differential inputs generally provide faster sensing than do single-ended sense amplifiers 150 (FIGS. 1 and 2). In addition, sense amplifiers 350 with differential inputs generally provide better tracking performance and noise cancellation due to the inherent "differential" input and output paths.

A difficulty in memory array 300 relates to the generation of the "½ cell reference current" that is about half the normal current through a virgin memory cell. FIG. 3 shows a common approach having reference word lines RWL1 to RWLn that are physically separated from the normal word lines WL1 to WLn. For a sensing operation, drive circuits 340 associated with reference word lines RWL1 to RWLn activate a selected reference word line using a voltage VR2 that is lower than the normal word line voltage VR1, (e.g., VR2 is about ½ VR1), in order to generate the "½ cell current". During programming, reference word lines RWL1 to RWLn typically remain "low" because the reference memory cells 115 typically remain in the erased or low Vt state.

FIG. 4 illustrates a contactless memory 400 that implements the reference techniques of FIG. 3 in a contactless memory architecture. Memory array 400 like memory array 300 employs word lines WL1 to WLn that are separate from reference word lines RWL1 to RWLn, and the difference in the bias voltages VR1 and VR2 respectively on the selected word lines and the selected reference word line causes the selected reference cell 215 to conduct only the desired "½ cell reference current."

The reference scheme of FIGS. 3 and 4 requires a substantial amount of supporting circuits, silicon area, power consumption, and increased circuit complexity. Typical required additional supporting circuits (not shown) include: a "precision" reference word line voltage generator; reference word line decoders and driver circuits, which are typically located at an end of the array opposite to the normal word line decoders and drivers; and reference word line redundancy circuits for the reference word line decoders and drivers. For this reference scheme, selection of the reference word line (and bank selects in memory array 500) preferably matches the location of the selected normal word line, in order to track the source line resistance and/or buried diffusion bit line and source line resistances, as well as the memory cell orientation effect. However, reference word lines RWL1 to RWLn physically differ from normal word lines WL1 to WLn, and the reference cells 115 or 215 cannot achieve 100% tracking with memory cells 125 or 225. For example, making the voltage levels for reference cells 115 or 215 perfectly track the corresponding voltage levels for memory cells 125 or 225 for temperature, supply voltage Vcc, and process variations would be very difficult or impossible. Also, the reference cells 115 and 215 experience disturb effects that differ from disturb effects on normal memory cell 125 or 225, and references cells 115 or 215 do not track the endurance cycling and aging effects on memory cells 125 or 225.

In view of the limitations of current referencing techniques for sensing operations, circuits and processes that provide good tracking of memory cell performance and fast sensing without undue power consumption or circuit complexity are sought.

SUMMARY

Auto-tracking bit line reference schemes employ differential sense amplifiers and have common reference and normal word lines. The bit line reference circuits can generate a "½ cell current" reference by programming reference cells at an intermediate level and/or providing reference bit lines with pull-up devices having a different effective size from the pull-up devices for the bit line. To provide a true "current mirror" connection of the pull-up devices of the bit line and the reference bit line, an additional reference bias bit line causes currents through the pull-up devices for the bit line, and the reference bit line to mirror current through the pull-up device for the reference bias bit line.

In one embodiment, the reference cells have a threshold voltage that is between the threshold voltages of an erased or low Vt memory cell and a programmed or high Vt memory cell. With the reference cell in an intermediate threshold voltage state, the reference cell draws a current (e.g., a "½ cell current") that is between the current drawn by an erased or low Vt memory cell and a programmed or high Vt memory cell.

To avoid programming the reference cells to a different level from the memory cells, another embodiment of the invention uses the reference bit lines with pull-up devices that differ in effective size from pull-up devices connected to the normal bit lines. The effective sizes of the pull-up devices can be fixed or adjustable dynamically or during testing. The pull-up devices generally have gates connected together and may be connected in a current mirror configuration. One configuration has a pull-up device for a bit line connected to mirror the current through a pull-up device for a reference bit line when the bit line and reference bit line are connected to a differential sense amplifier for a sensing operation. Another configuration has a first reference bit line with a pull-up device coupled to provide a bias voltage such that pull-up devices on a second reference bit line and normal bit lines mirror the current on the first reference bit line. The sizes of the pull-up devices are selected for sensing by a differential sense amplifier connected to a selected normal bit line and the second reference bit line.

The continuous word lines select reference cells and normal memory cells for sensing, and the difference in the sizes of the pull-up devices and/or the threshold voltage of the reference cells causes the net current on the reference bit line connected to the differential sense amplifier to be at a desired level, e.g., at one half of the current of a memory cell in the low Vt state. Multiple reference bit lines with reference cells having different threshold voltages and/or pull-up devices having different sizes can provide a number of different reference signals for use in a multiple-bit-per-cell memory.

BRIEF DESCRIPTION OF THE DRAWINGS

Use of the same reference symbols in different figures indicates similar or identical items.

DETAILED DESCRIPTION

In accordance with an aspect of the invention, semiconductor memories implementing sensing operations use differential sense amplifiers having differential terminals connected to a bit line and a reference bit line and use continuous word lines that simultaneously activate memory cells and reference cells. Accordingly, the memories have fast and reliable sensing that differential sense amplifiers can provide. The memories also avoid circuit complexity and additional circuit area required for separate word lines and reference word lines and associated decoding and redundancy circuitry.

Figure 1:
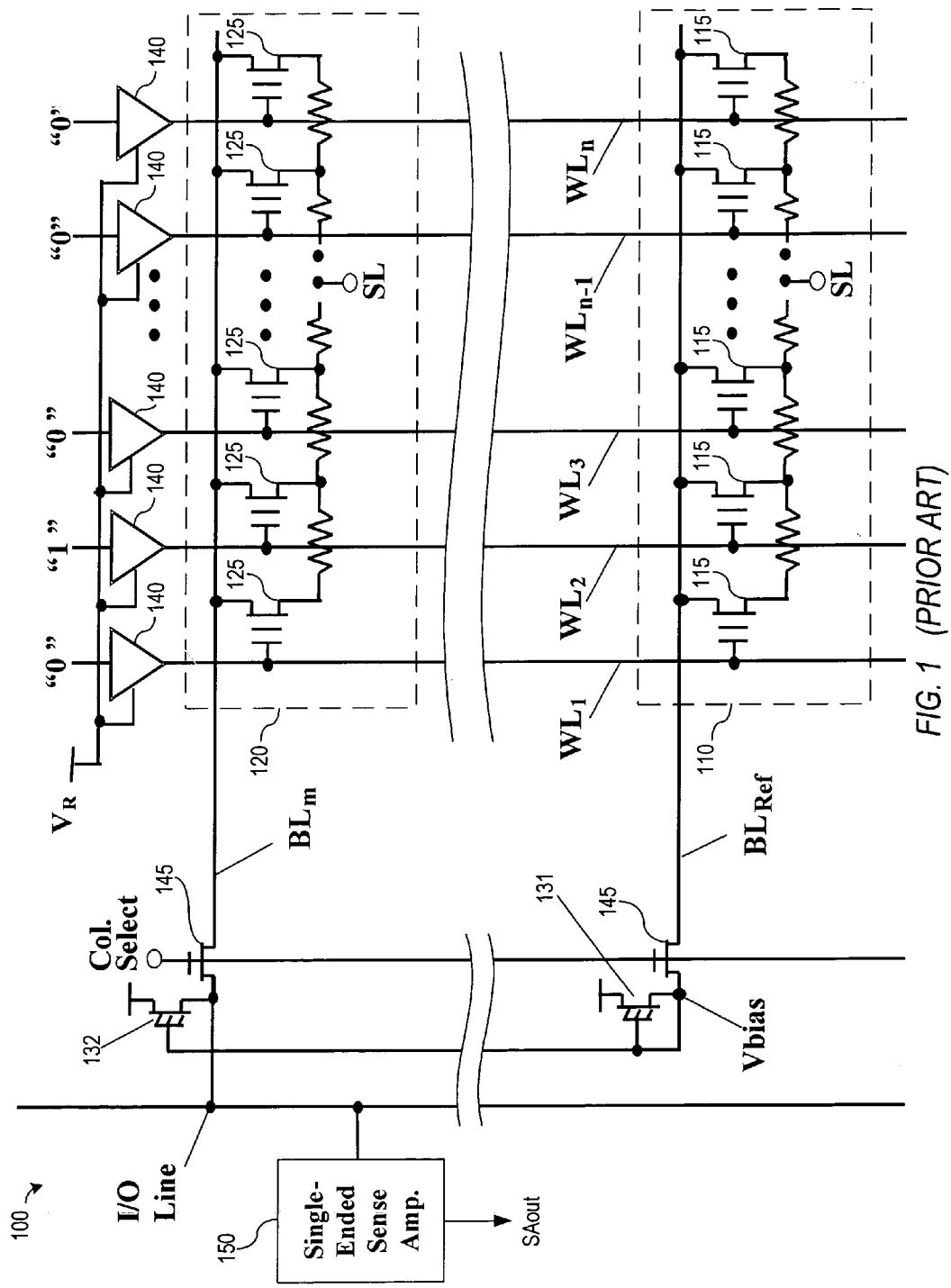
FIG. 1 illustrates a conventional bit-line reference scheme for single-ended sense amplifiers shown with a conventional Flash memory array.
Figure 2:
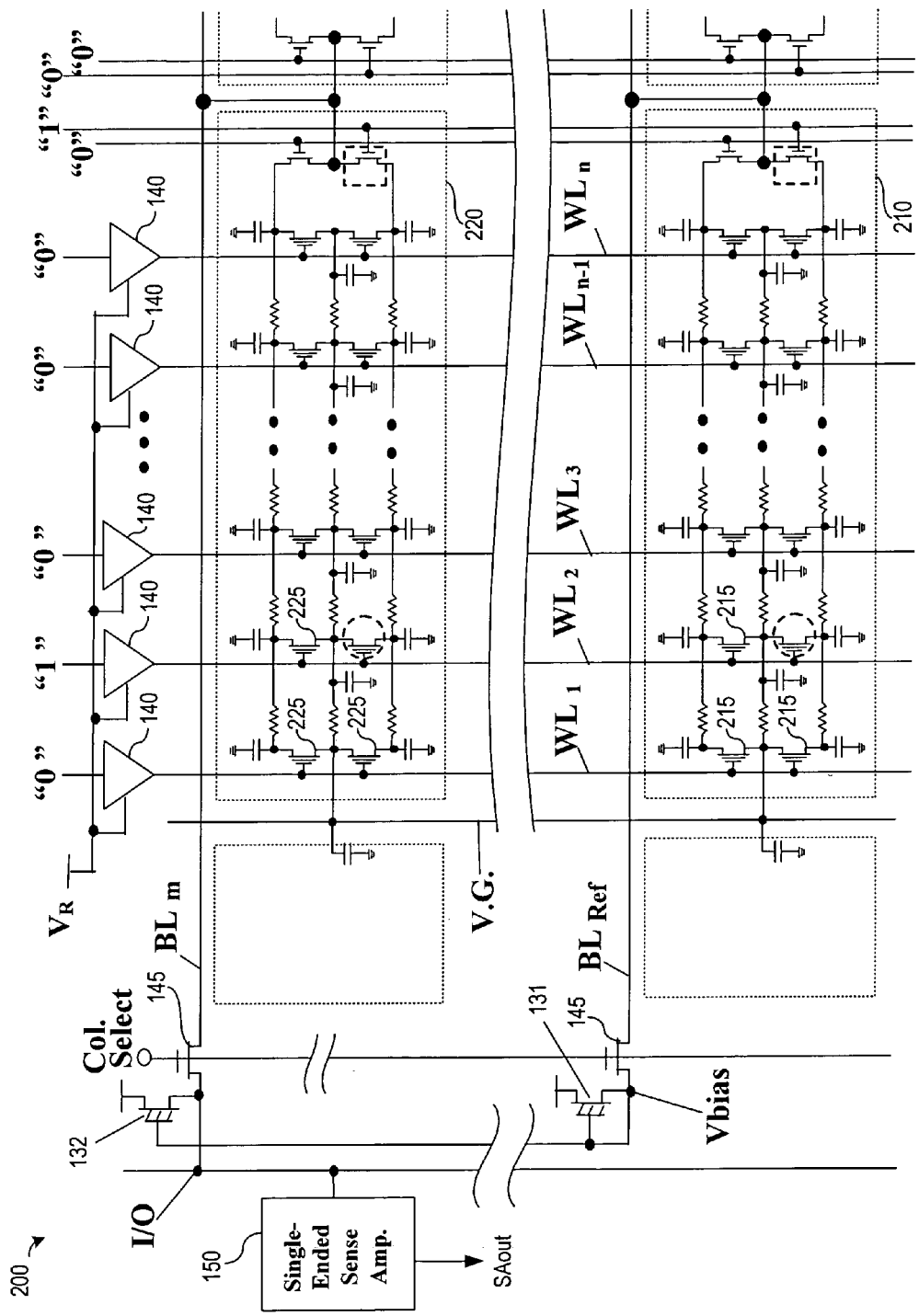
FIG. 2 illustrates a conventional bit-line reference scheme for single-ended sense amplifiers shown with a conventional contactless Flash memory array.
Figure 3:
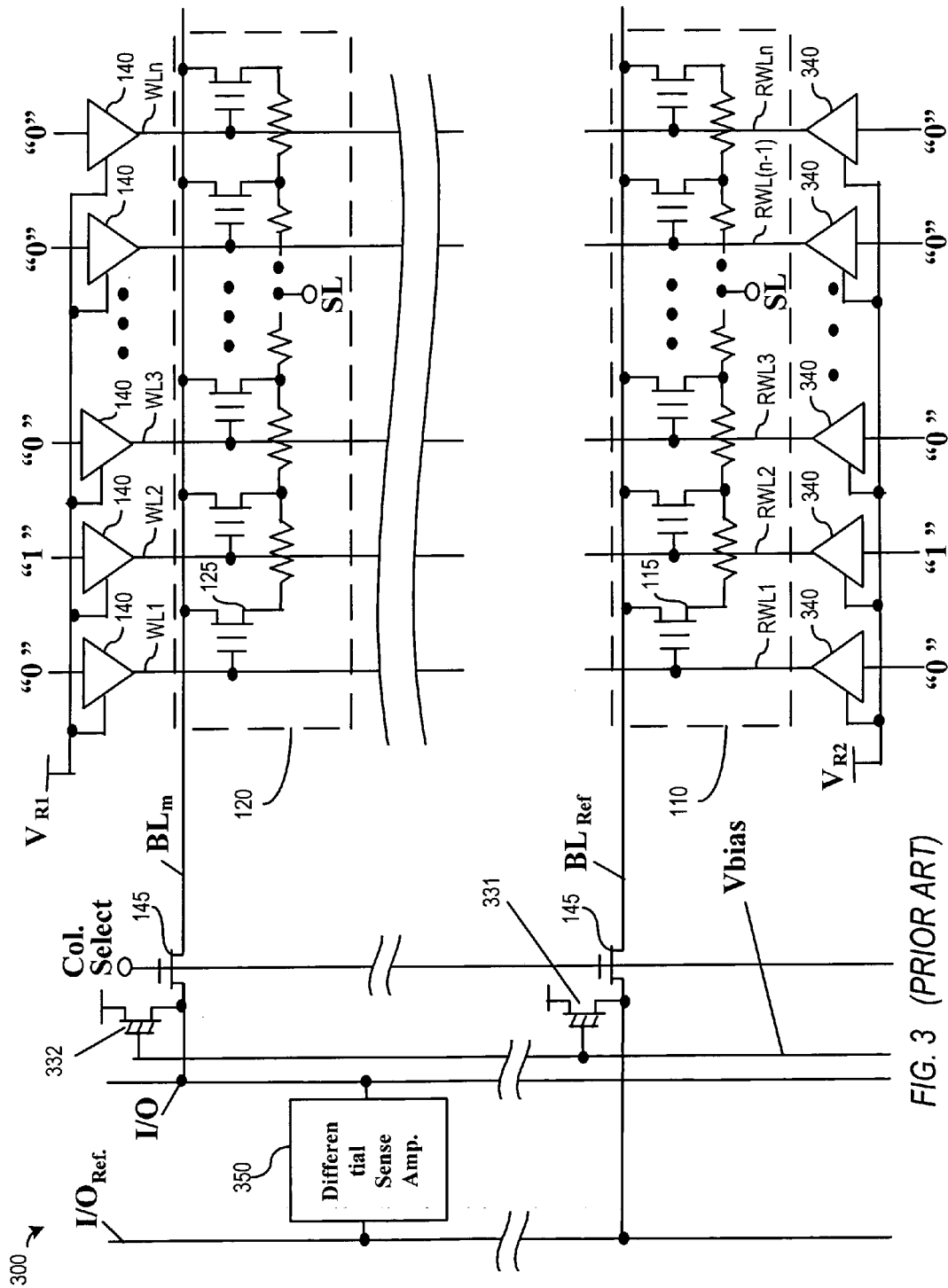
FIG. 3 illustrates a conventional bit-line reference scheme for sense amplifiers with differential inputs shown with a conventional Flash memory array.
Figure 4:
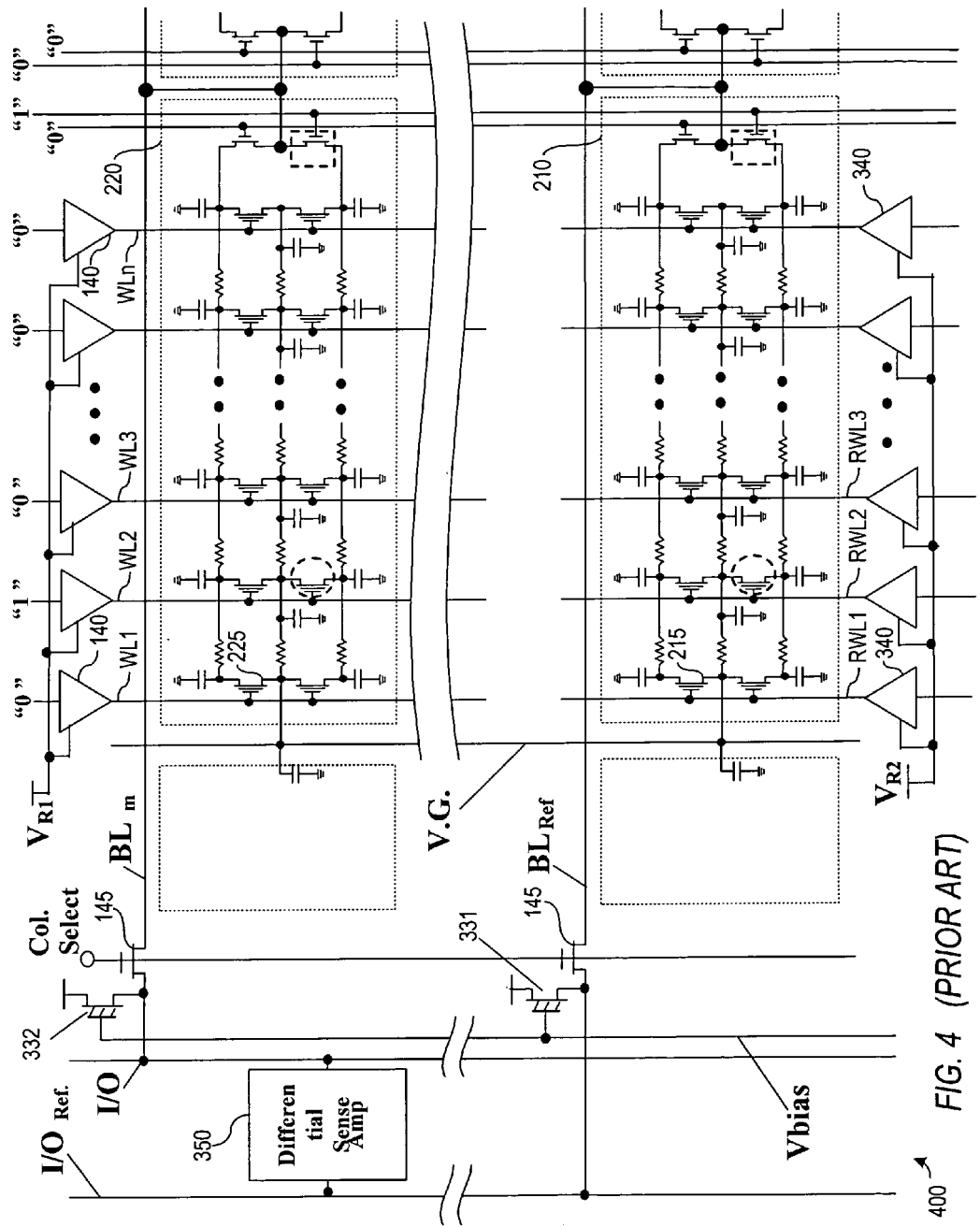
FIG. 4 illustrates a conventional bit-line reference scheme for sense amplifiers with differential inputs shown with a conventional contactless Flash memory array.
Figure 5:
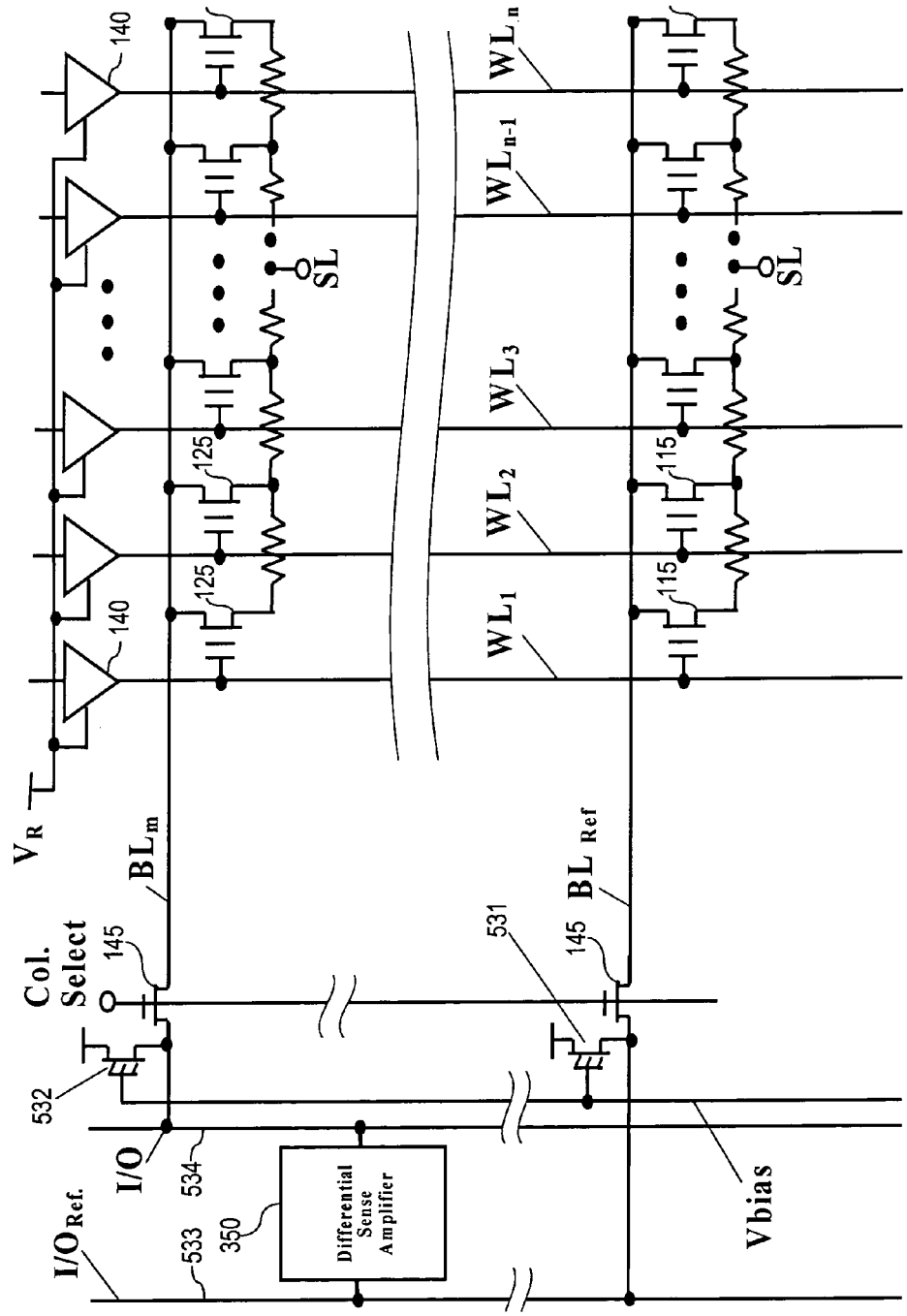
FIG. 5 illustrates a Flash memory in accordance with an embodiment of the invention having a bit-line reference scheme using common word lines/reference word lines and sense amplifiers with differential inputs.

FIGS. 5 illustrates a binary Flash memory array 500 using a bit line reference circuit in accordance with one embodiment of the invention. Memory array 500 uses differential sense amplifiers 350 and continuous word lines WL1 to WLn. Differential amplifiers 350 may provide faster and more reliable sensing than would a single-ended sense amplifier such as used in memory array 100 of FIG. 1. The continuity of word lines WL1 to WLn results in the word line voltages for reference cells 115 precisely tracking the word line voltage for memory cell 125, and eliminates the need for the extra reference word line decoders, drivers and redundancy circuits, which prior memories such as memory array 300 of FIG. 3 require for reference word lines.

A sensing operation in memory array 500 uses a reference current that a reference cell 115 and a P-channel bit line pull-up device 531 generate on reference bit line BLref. Memory array 500 generates a reference current of the desired magnitude by programming reference memory cells 115 to a threshold voltage that is between the threshold voltage of an "erased" or low Vt memory cell and the threshold voltage of a "programmed" or high Vt memory cell. In one specific embodiment, the threshold voltage of reference cells 115 is halfway between the threshold voltages of erased or low Vt and programmed or high Vt memory cells 125, but reference cells 115 more generally have a threshold voltage selected to provide the desired reference current on reference bit line BLref. This bit line reference scheme requires memory array 500 to accommodate the extra programming time overhead for programming reference cells 115, but reference cells 115 can be programmed during, before, or after the programming of normal memory cells 125.

Programming a reference cell 115 to the desired threshold voltage can be achieved using a programming operation that includes interleaved program cycles and verify cycles. During each program cycle, programming voltages are applied to gate, source, and drain of a reference cell 115 to increase the threshold voltage of the reference cell 115. During a verify cycle, which follows after one or more programming cycle, the threshold voltage of the reference cell 115 is compared to a mid-level target voltage. In particular, during a verify cycle for a selected reference cell 115, word line drivers 140 drive the selected word line voltage $V_R$ to the mid-level target voltage (e.g., about 3.5 volts for low and high Vt levels of less than or about equal to 2V and greater than or about equal to 5V, respectively). Verify circuitry that compares the threshold voltage of a reference cell 115 to the target threshold voltage can employ any sensing technique, including, for example, biasing an I/o reference line 533 with a fixed reference, disabling sense amplifier 340, and using a single-ended sense amplifier (not shown) to compare the current on reference bit line BLref to the fixed reference. Programming cycles for the selected reference cell 115 stop when one or more verify cycles indicate the selected reference cell 115 has reached the mid-level target threshold voltage.

Memory cells 125 can be programmed using substantially the same circuits and techniques to implement the interleaved program cycles and verify cycles, but using a different fixed reference (not shown) connected to I/O line 534. Another alternative is to bias the I/O line 534 to a fixed reference level and use differential sense amplifier 350 to compare the current on reference bit line BLref to the current on the selected bit line. Alternatively, verify cycles during programming of a selected memory cell 125 can use the differential sensing techniques used during the read operations if reference cells 115 are programmed before programming memory cells 125.

During read operations in memory array 500, a word line driver 140 corresponding to the selected word line drives the gate voltages of both selected memory cells 125 and reference memory cell 115 to a voltage $V_R$ to a level about equal to a mid-level voltage (e.g., about 3.5). Depending on the threshold voltage state of the selected binary memory cell 125, the selected memory cell 125 conducts either a current about equal to the "normal" current for an erased or low Vt memory cell or a "zero" current for a programmed or high Vt memory cell. The selected reference cell 115 preferably conducts a ½ cell current or more generally current is less than the "normal" current but greater than the "zero" current. Bit line pull-up devices 531 and 532, which are respectively connected to the reference bit line BLref and the selected bit line BLm, have substantially the same size and have gates at the same bias voltage Vbias. The resulting bias currents through pull-up devices 531 and 532 are substantially equal so that differential sense amplifier 350 senses whether the current through the selected memory cell 125 is greater or less than the reference current through reference memory cell 115.

Figure 6:
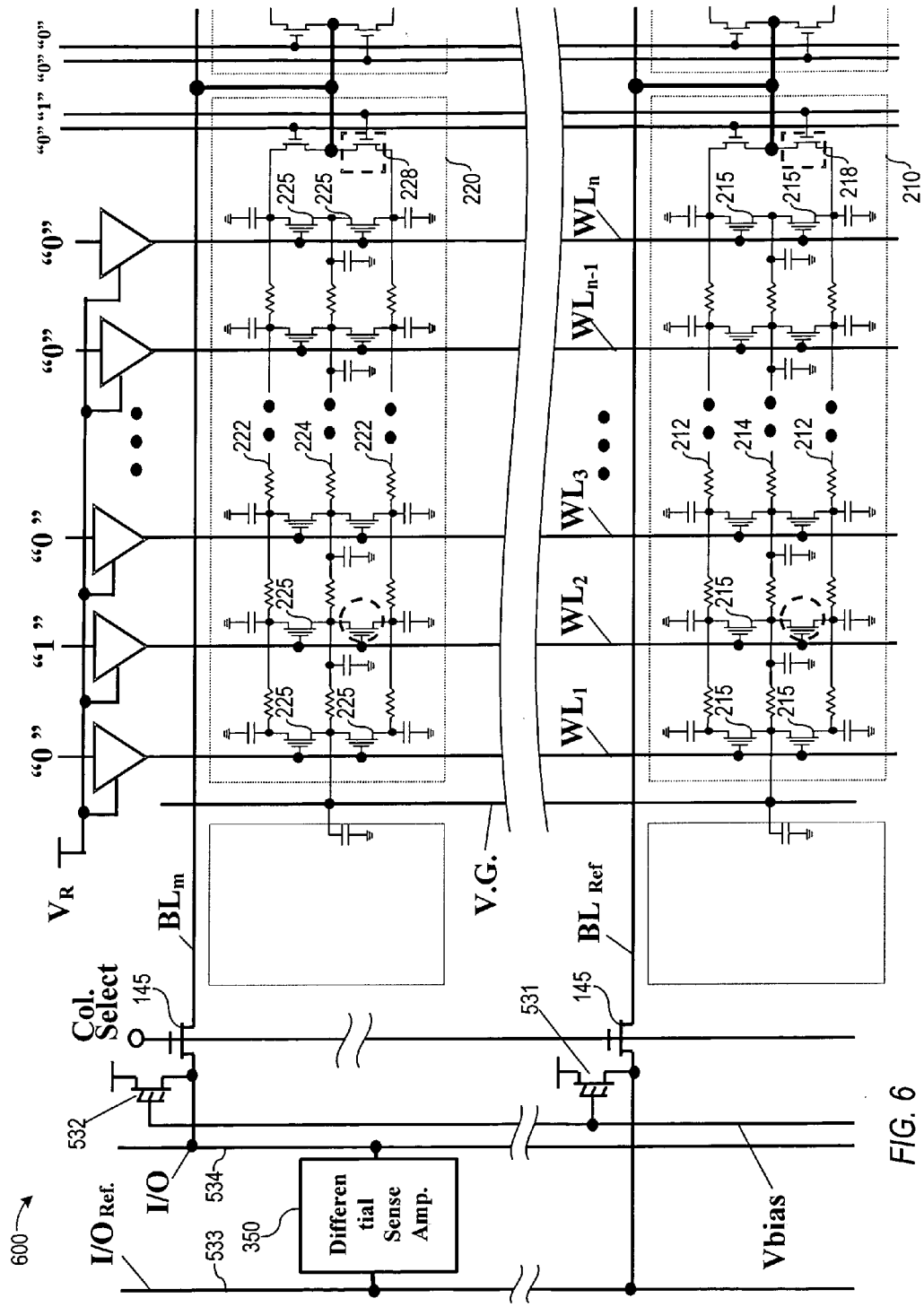
FIG. 6 illustrates a contactless Flash memory in accordance with an embodiment of the invention having a bit-line reference scheme with common word lines/reference word lines and sense amplifiers with differential inputs.

FIG. 6 illustrates a memory array 600 employing a contactless Flash memory array architecture with the same bit line reference circuits as used in memory array 500 of FIG. 5. Memory array 600 has reference banks 210 of reference cells 215 and memory banks 220 of memory cells 225. Each reference bank 210 includes diffused bit lines 212 and diffused source lines 214 that form drains and sources of reference cells 215. Each memory bank 220 of memory cells 225 similarly includes diffused bit lines 222 and diffused source lines 224 that form drains and sources of memory cells 225. Diffused source lines 214 and 224 connect to a virtual ground potential VG. Diffused bit lines 212 in reference bank 210 connect to corresponding metal reference bit lines BLref through bank select devices 218, and diffused bit lines 222 in memory bank 220 connect to corresponding metal bit lines BLm through bank select devices 228. Bank selection or decoding for reference bank 210 and memory bank 220 are the same so that separate decoding and redundancy circuits are not required. Other than the connections between the reference cells 215 and the reference bit line BLref and the connections between the memory cells 225 and corresponding bit lines BLm, memory array 600 operates in the same manner and uses the same bit line reference generation techniques as used in memory array 500 (FIG. 5) described above.

FIGS. 5 and 6 provide examples of memory arrays 500 and 600 employing a bit line reference circuits and techniques in accordance with an embodiment of the invention. However, the bit line reference circuits and techniques are not limited to the architectures of FIGS. 5 and 6. Other memory architectures (contactless or otherwise) using different connections of memory cells and reference cells to bit lines and reference bit lines can also employ the same bit line reference scheme.

Figure 7:
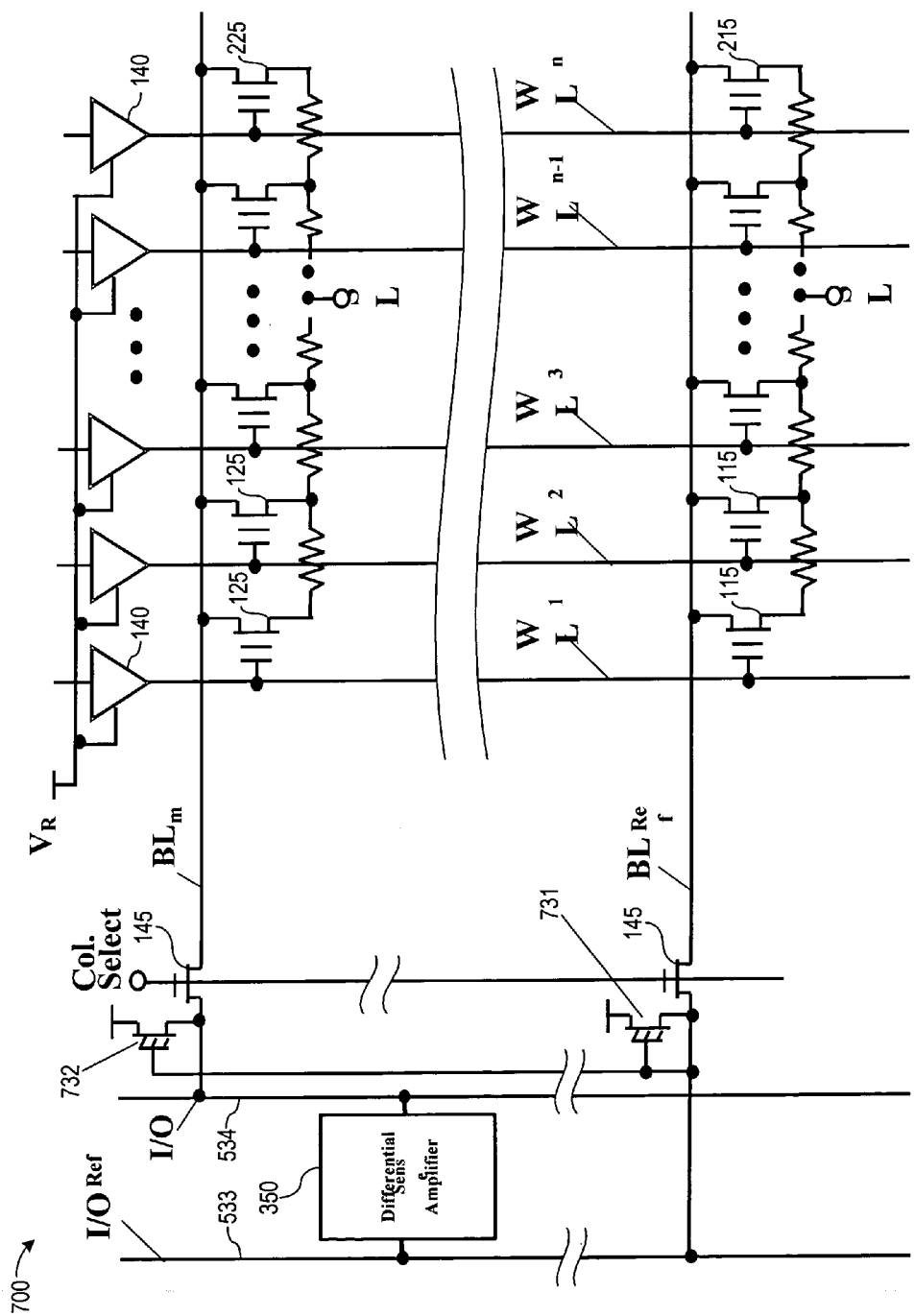
FIG. 7 illustrates a Flash memory in accordance with an embodiment of the invention using an auto-tracking bit-line reference scheme for sense amplifiers with differential inputs.

FIG. 7 illustrates a memory array 700 employing bit line reference scheme in accordance with another embodiment of the invention. Memory array 700 has continuous word lines WL1 to WLn and differential sense amplifiers 350 but does not require programming reference memory cells 115 to a threshold voltage that is between the threshold voltages of erased or low Vt and programmed or high Vt memory cells. Instead, memory array 700 keeps reference memory cells 115 in the "erased" or low Vt state, which typically results in a maximum cell current during read operations. Eliminating the need to program reference cells 115 to a midpoint threshold voltage level makes the bit line referencing in memory arrays 700 simpler to implement and requires less integrated circuit area.

A conventional erase operation can simultaneously erase both memory cells 125 and reference cells 115 in a sector. Depending on the erase process in memory array 700, reference cells 115 may need to be reset or programmed (to a "high" threshold voltage state) before an erase operation to stop the erase operation from overerasing reference cells 115. The matching of the program and erase operations of memory cells 125 and reference cells 115 combined with the sharing of word lines WL1 to WLn across reference cells 115 and memory cells 125 improves the tracking of endurance cycling, aging and cell disturb effects.

Memory array 700 contains P-channel bit line pull-up devices 731 and 732 that respectively pull up reference bit line BLref and bit line BLm. Unlike the previous referencing circuits having P-channel pull-up devices that use an externally generated gate bias signal Vbias and have the same or nearly the same device size (W/L), P-channel biasing devices 731 and 732 are connected in a "current-mirror" configuration and have relative sizes selected for the sensing operation. More specifically, bit line biasing device 731 has a gate and source connected to reference I/O line 533 to form a current source. When a column select device 145 connects reference bit line BLref to reference I/O line 533, biasing devices 731 conducts a pull-up current equal to the current through a reference cell 115, which is the normal memory cell current for the erased or low Vt state. This current source 731 is mirrored to all other P-channel I/O biasing transistors 732, which are connected to bit lines BLm through column select devices 145.

Proper selection of the relative transistor sizes of pull-up devices 731 and 732 can provide to the bit lines BLm any percentage or portion of the normal cell current through the erased reference cell 115. For example, if reference I/O line biasing transistor 731 has channel width to channel length ratio (W1/L1) that is twice the ratio (W2/L2) for I/O line biasing transistor 732, then I/O line biasing transistor 732 will conduct half the pull-up current of reference I/O line biasing transistor 731 or about half the normal cell current of an erased or low Vt memory cell. The relative P-channel pull-up current differences are normally implemented by ratioing the number of transistors with the same transistor sizes (or W/Ls) to provide good tracking. Such P-channel transistors can have fixed connections to provide a fixed effective size for the pull-up devices or connections of the P-channel transistors can be dynamically adjustable (e.g., using fuses or transistors/switches) to select the effective size of a pull-up device after testing or during the life of the memory. In one embodiment of the invention, I/O line 534 has a pull-up device 732 consisting of a single P-channel transistor, and reference I/O line 533 has a pull-up device 731 including two of the same size P-channel transistors with gates and sources connected together and to the gate of P-channel pull-up device 732. If the I/O lines 533 and 534 have the same or nearly the same capacitance loading, the current differences between pull-up devices 533 and 534 essentially generate a small differential voltage (across the I/O line pair) required for sense amplifier 350 to sense correctly.

Figure 8:
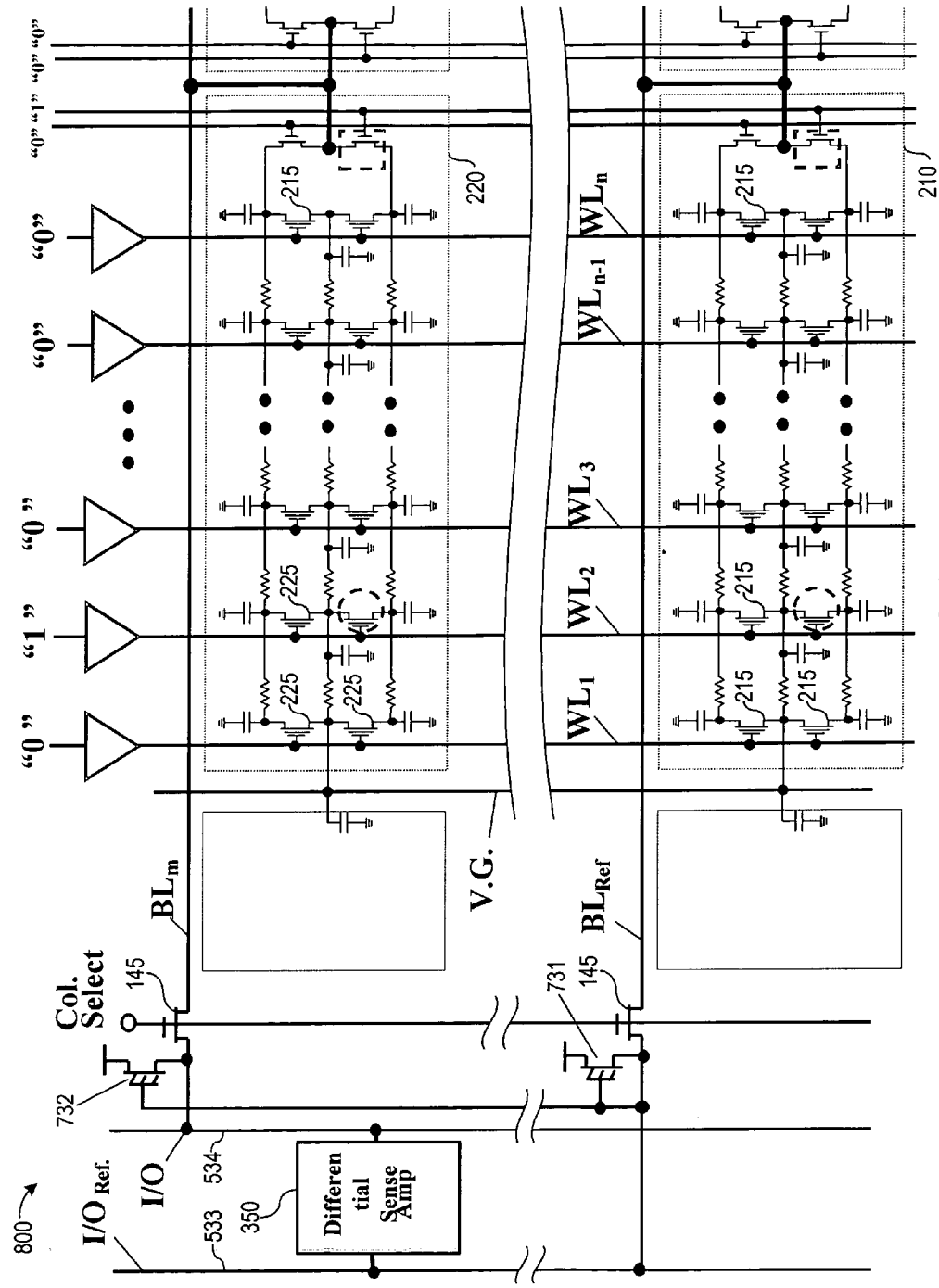
FIG. 8 illustrates a contactless Flash memory in accordance with an embodiment of the invention using an auto-tracking bit-line reference scheme for sense amplifiers with differential inputs.

FIG. 8 illustrates a memory array 600 employing a contactless Flash memory array architecture with the same bit line reference circuits as used in memory array 700 of FIG. 7.

Figure 9:
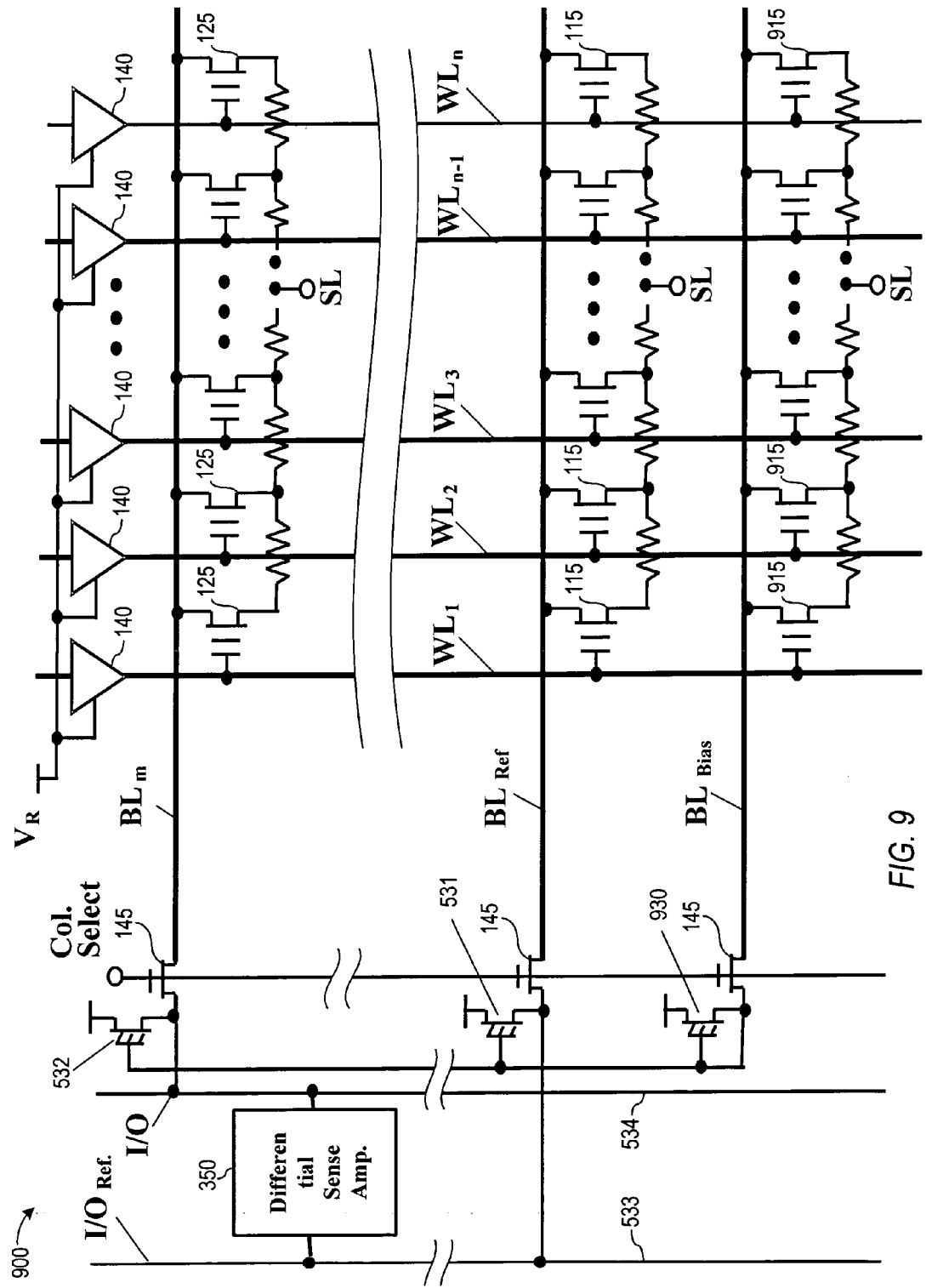
FIG. 9 illustrates a Flash memory in accordance with an embodiment of the invention using another auto-tracking bit-line reference scheme for sense amplifiers with differential inputs.

FIG. 9 illustrates a memory array 900 employing bit line reference circuits in accordance with yet another embodiment of the invention. Memory array 900 includes columns of memory cells 125 connected to respective bit lines BLm, a column of reference cells 115 connected to a reference bit line BLref, and a column of reference cells 915 connected to a bias bit line BLbias. Preferably, reference cells 915 are substantially identical to reference cells 115 and memory cells 125. Bias bit line BLbias is substantially identical to reference bit line BLref and bit line BLm, except for the sizes of connected P-channel pull-up devices 930, 531, and 532. In memory array 900, the gates of pull-up devices 930, 531, and 532 are connected together and to the source of pull-up device 930 so that the currents through pull-up devices 531 and 532 mirror the current through pull-up device 930.

During sensing, column select devices 145 connect the selected bit line BLm to I/O line 534 and pull-up device 532, connect reference bit line BLref to reference I/O line 533 and pull-up device 531, and connect bias bit line BLbias to pull-up device 930. Word line drivers 140 activate and select one of word lines WL1 to WLn, which are continuous and connected to the selected memory cell 125, one reference cell 115, and one reference cell 915. Reference cells 915 are in the low Vt or erased state, so that the activated word line turns on a reference cell 915, which then conducts the normal cell current to pull down bias bit line BLbias. Pull-up device 930 conducts a matching current to maintain an equilibrium voltage on bias bit line BLbias. Pull-up device 930 effectively generates a bias voltage Vbias for pull-up devices 531 and 532. The overhead of this extra reference bias bit line BLbias is insignificant because memory array 900 typically has a large number of bit lines. In accordance with a further aspect of the invention, the relative sizes of pull-up devices 930, 531, and 532 can be selected to avoid the need for programming reference cells 115 to an intermediate threshold voltage.

Since the normal cell current (from bias bit line BLbias) is now mirrored to both I/O lines 533 and 534, memory array 900 has optimal bit line reference tracking, and the maximum flexibility in selecting the "memory cell current" ratio among the bias bit line BLbias, reference bit line BLref, and normal bit lines BL. In a case where pull-up devices 930, 531, and 532 consist of X, Y, and Z equal-size P-channel transistors, the values for X, Y, and Z can be selected to provide the desired reference current. Table 1 illustrates an example configuration where X, Y, and Z are 4, 4, and 2, respectively so that the corresponding pull-up currents are 1×, 1×, and 0.5× of the normal erased or low Vt cell current. Making pull-up devices 930 and 532 the same improves tracking.

TABLE 1

| | X = 4, Y = 4, and Z = 2 | | | |
|---|---|---|---|---|
| | | Reference | Normal Bit Line | |
| Current Level at: | Bias Bit Line | Bit Line | "1" | "0" |
| P-channel Pull-Up | 40 μA ↑ | 40 μA ↑ | 20 μA ↑ | 20 μA ↑ |
| Memory Cell (Pull-Down) | 40 μA ↓ | 40 μA ↓ | 40 μA ↓ | ≈0 μA |
| Net Current: | — | — | 20 μA ↓ | 20 μA ↑ |
| Δ Net Current (Ref. BL–BL) | — | — | ≈20 μA | ≈20 μA |

Table 1 illustrates that memory array 900 can generate "½ cell current" as a reference current for a sensing operation. This referencing scheme further provides flexibility in selecting the "memory cell current" ratio among the reference bias bit line, reference bit line, and normal bit lines. In particular, the reference signal from reference bit line BLref, which is connected to sense amplifier 350, is not limited to a case where the reference pull-up device conducts the normal current, which is generally the case when a pull-up device and an activated erased or low Vt reference cell are connected to a reference bit line.

Both the P-channel pull-up devices 531 and 532 now have exactly the same configuration, as opposed to memory array 700 (FIG. 7), which a P-channel pull-up device 731 for the reference I/O line 533 connected in a "current source" configuration with gate and source shorted together, while the P-channel pull-up device 732 for normal I/O line 534 is connected as a current mirror, with the gate and source separate. This small difference would mean that memory array 700 does not bias the I/O lines 533 and 534 as a "true" current mirror, while memory array 900 does bias I/O lines 533 and 534 as "true" current mirror, because both transistors are biased in exactly the same way (with the gate separated from the source).

Figure 10:
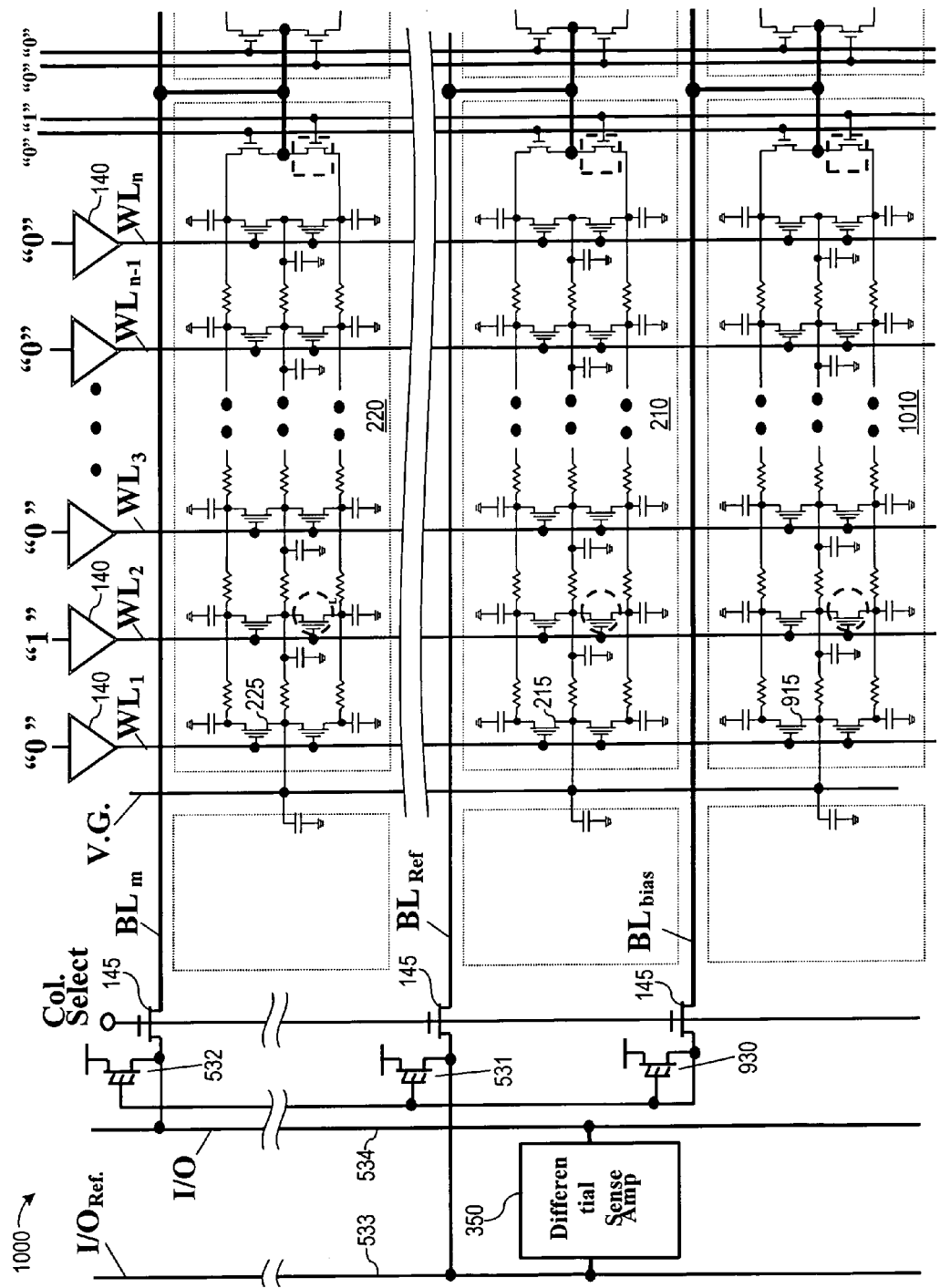
FIG. 10 illustrates a contactless Flash memory in accordance with an embodiment of the invention using another auto-tracking bit-line reference scheme for sense amplifiers with differential inputs.

FIG. 10 illustrates an embodiment of the invention that uses the bit line reference circuits and techniques of FIG. 9 in a contactless Flash memory array 1000. Flash memory array 1000 has a bank including a set 220 of memory cells 225, a first set 210 of reference cells 215, and a second set 1010 of reference cells 915. Convention decoding and bank selection circuits, which are well-known for contactless memory, connect memory cells 225 to corresponding metal bit lines BLm, reference cells 115 to metal reference bit line BLref, and reference cells 915 to metal bias bit line BLbias. Otherwise, memory array 1000 performs sensing in the same manner as memory array 900 of FIG. 9 described above.

Figure 11:
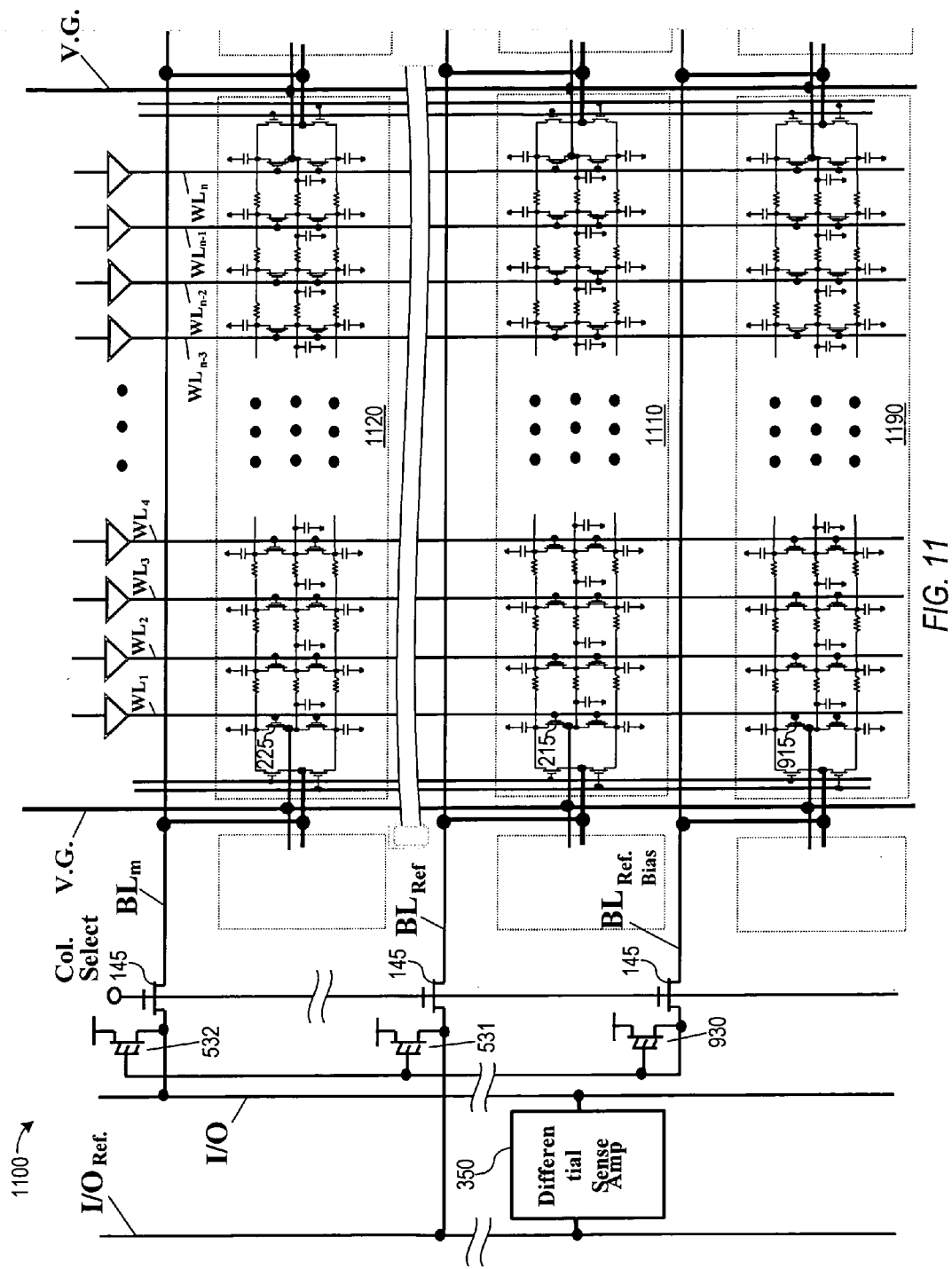
FIG. 11 illustrates a contactless Flash memory in accordance with an embodiment of the invention using a shared buried diffusion bit-line and an auto-tracking bit-line reference scheme for sense amplifiers with differential inputs.

FIG. 11 shows another contactless Flash memory array 1100 employing the bit line referencing of FIG. 9. Flash memory array 1100 employs an architecture that has a shared buried diffusion bit-line architecture such as described in U.S. patent application Ser. No. 09/882,136, entitled "Contactless Flash Memory With Shared Buried Diffusion Bit Line Architecture", which is hereby incorporated by reference in its entirety.

Figure 12:
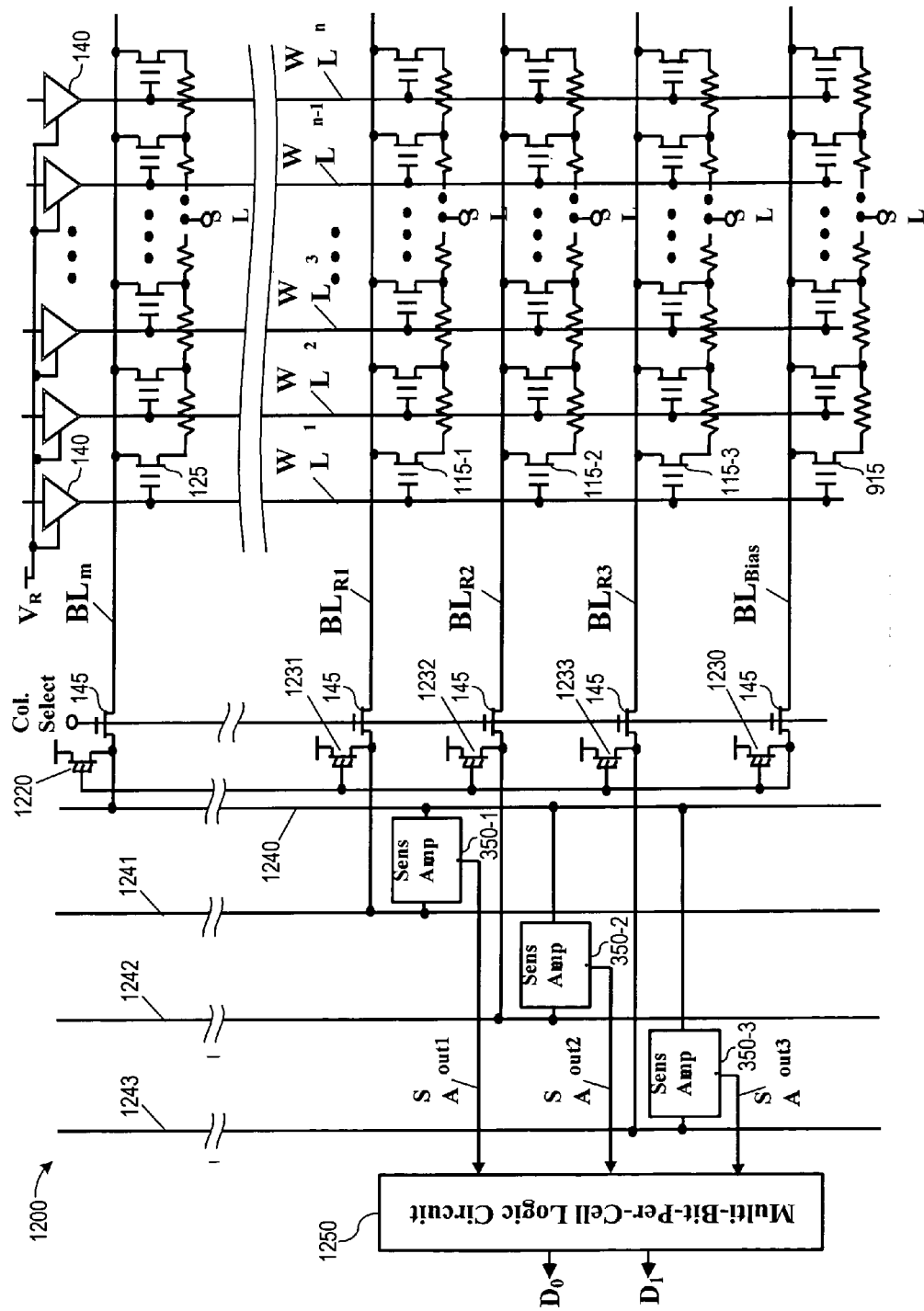
FIG. 12 illustrates a multi-level or multiple-bit-per-cell Flash memory using reference circuits in accordance with an embodiment of the invention.

FIG. 12 illustrates a multiple-bit-per-cell or multilevel Flash memory array 1200 including bit line reference circuits in accordance with yet another embodiment of the invention. Memory array 1200 includes columns of normal memory cells 125 connected to bit lines BLm, columns of reference cells 115 connected to respective reference bit lines, and a column of reference cells 915 connected to a bias bit line BLbias. In memory array 1200, the number of reference bit lines depends on the number of bit line references needed. FIG. 12 illustrates an embodiment including three reference bit lines BLr1, BLr2, and BLr3 that generate three bit line reference signals used for reading two data bits D0 and D1 from the selected memory cell 125 during a read operation. Four-bit-per-cell storage would typically require 15 different reference bit lines that generate 15 different bit line reference signals used for reading 4 data bits. Generally, the number of reference lines required will vary with the number of bits or the number of levels stored per memory cell 125 and may vary according to the read method.

Column select circuitry 145 connects reference bit lines BLr1, BLr2, and BLr3 to respective reference I/O lines 1241, 1242, and 1243 when connecting the selected bit line BLm to an I/O line 1240. Three sense amplifiers 350-1, 350-2, and 350-3 sense a difference between I/O line 1240 and reference I/O lines 1241, 1242, and 1243, respectively, and a logic circuit 1250 generates output data bits D0 and D1 from output signals SAout1, SAout2, and SAout3 from sense amplifiers 350-1, 350-2, and 350-3 during a sensing or read operation.

For a read operation, reference bit lines generate reference signals that are between the levels generated for four different threshold voltage states of a two-bit-per-cell memory. In a first embodiment of memory array 1200, pull-up devices 1220, 1230, 1231, 1232, and 1233 have the same effective size. Reference cells 915 are in the erased or low Vt state, and reference cells 115-1, 115-2, and 115-3 are in the threshold states having threshold voltages between the target levels for memory cells 125 storing data.

For illustration, the data storage scheme used in throughout the following description of exemplary embodiments of the invention uses a Gray code ordering of data values with increasing threshold voltage. For example, a memory cell 125 in the erased or lowest Vt state has a threshold voltage of about 2 volts and represents a 2-bit value 01 in the illustrative data storage scheme, and memory cells 125 having threshold voltages of about 3 volts, 4 volts, and 5 volts respectively represent stored data values 11, 10, and 00. Other alternative data storage schemes could also be employed without departing from the spirit of the invention.

For the illustrative data storage scheme, the first bit line reference scheme for memory array 1200 programs reference cells 115-1, 115-2, and 115-3 to have threshold voltages 2.5 volts, 3.5 volts, and 4.5 volts, which are between the threshold voltage states representing data. A programming operation including interleaved program and verify cycles implemented with conventional programming circuits can program reference cells 115-1, 115-2, and 115-3 to the desired threshold voltage levels.

During a read operation, reference bit line BLr1 generates a reference between the bit line voltage of a memory cell 125 storing 01 and a memory cell 125 storing 11. Reference bit line BLr2 generates a reference between the bit line voltage of a memory cell 125 storing 11 and a memory cell 125 storing 10, and reference bit line BLr3 generates a reference between the bit line voltage of a memory cell 125 storing 01 and a memory cell 125 storing 00. Accordingly, if the selected memory cell 125 represents value 01 (i.e., is in the erased or lowest Vt state), all of sense amplifiers 350-1, 350-2, and 350-3 trip. If the selected memory cell 125 represents value 11 (i.e., has a threshold voltage of about 3V), sense amplifiers 350-2 and 350-3 trip, but sense amplifier 350-1 does not. If the selected memory cell 125 represents value 10, sense amplifiers 350-3 trips, but sense amplifier 350-1 and 350-2 do not, and if the selected memory cell 125 represents value 00, none of sense amplifiers 350-1, 350-2, and 350-3 trip.

In a second embodiment of memory array 1200, all of the reference cells 915, 115-1, 115-2, and 115-3 are in the erased state or lowest Vt state and the effective sizes of a pull-up device 1230 for bias bit line BLbias, pull-up devices 1231, 1232, and 1233 respectively for reference I/O lines 1241, 1242, and 1243, and a pull-up device 1220 for I/O line 140 are selected to generate the desired bit line references. The effective size of pull-up devices 1230 to 1233 can be fixed or dynamically adjustable after testing or during the life of the memory 1200. Table 2 illustrates an exemplary configuration of the sizes of pull-up devices 1231, 1232, and 1233 when pull-up devices 1220 and 1230 have the same size W0/L0. In Table 2, IN represents the normal current drawn by a memory cell 125 in the lowest threshold voltage state, which represents a data value 01. The threshold voltage state corresponding to data value 11, 10, and 00 respectively correspond to memory cell currents that are 0.7×IN, 0.4×IN, or 0.1×IN.

TABLE 2

| Ref. Bit Line | Pull-up Device Size | Pull-Up Current | Vt State of Ref. Cell | Ref. Cell Current | Net Ref. Current |
|---|---|---|---|---|---|
| BLr1 | 1.15 × (W0/L0) | 1.15 × IN | 01 (lowest) | −1.0 × IN | 0.15 × IN |
| BLr2 | 1.45 × (W0/L0) | 1.45 × IN | 01 (lowest) | −1.0 × IN | 0.45 × IN |
| BLr3 | 1.75 × (W0/L0) | 1.75 × IN | 01 (lowest) | −1.0 × IN | 0.75 × IN |

In a third embodiment of memory array 1200, bias reference cells 915 are in the erased or lowest Vt state, reference cells 115-1, 115-2, and 115-3 are in programmed states corresponding to the same threshold voltage levels representing stored data, and pull-up devices 1220, 1230, 1231, 1232, and 1232 have effective sizes selected to generate the desired bit line reference currents.

One exemplary configuration illustrating the third embodiment of memory array 1200 has reference cells 915 in a Vt state (e.g., lowest Vt state) representing data value 01, reference cells 115-1 in a Vt state representing data value 11, reference cells 115-2 in a Vt state representing data value 10, and reference cells 115-3 in a Vt state (i.e., the highest Vt state) representing data value 00. Pull-up devices 1220 and 1230 have the same effective size, and pull-up devices 1231, 1232, and 1233 have effective sizes that are smaller than the effective size of pull-up device 1220 or 1230. With this configuration, reference bit line BLr1 supplies a bit line reference current that is smaller than a bit line current for a selected memory cell 125 in the Vt state represent data value 11 because pull-up transistor 1231 for reference I/O line 1241 is smaller than the pull-up transistor 1220 for I/O line 1240. The size of pull-up transistor 1231 is selected to provide a bit line reference current at the desired level, which is between the bit line currents corresponding to memory cells storing values 01 and 11. Table 3 illustrates an exemplary configuration of the sizes of pull-up devices 1231, 1232, and 1233 when pull-up devices 1220 and 1230 have the same size W0/L0 and the memory cells have the same performance as in Table 2 above.

TABLE 3

| Ref. Bit Line | Pull-up Device Size | Pull-Up Current | Vt State of Ref. Cell | Ref. Cell Current | Net Ref. Current |
|---|---|---|---|---|---|
| BLr1 | 0.85 × (W0/L0) | 0.85 × IN | 11 | −0.7 × IN | 0.15 × IN |
| BLr2 | 0.85 × (W0/L0) | 0.85 × IN | 10 | −0.4 × IN | 0.45 × IN |
| BLr3 | 0.85 × (W0/L0) | 0.85 × IN | 00 (Highest) | −0.1 × IN | 0.75 × IN |

In an alternative configuration of the third embodiment of memory array 1200, pull-up devices 1231, 1232, and 1233 have effective sizes that are larger than the effective size of pull-up device 1220 or 1230. For this configuration, reference cells 115-1 is in the lowest Vt state and represents data value 01, reference cells 115-2 is in a Vt state representing data value 11, and reference cells 115-3 in a Vt state representing data value 10. The larger pull-up devices 1231, 1232, and 1233 cause the respective reference bit line currents to be larger than the bit line currents corresponding to selected memory cells 125 storing data values 01, 11, and 10, and the sizes of pull-up devices 1231, 1232, and 1233 can be selected to provide the desired bit line references. Table 4 illustrates an exemplary configuration of the sizes of pull-up devices 1231, 1232, and 1233 for this embodiment of the invention when pull-up devices 1220 and 1230 have the same size W0/L0 and the memory cells have the same properties as described for Tables 2.

TABLE 4

| Ref. Bit Line | Pull-up Device Size | Pull-Up Current | Vt State of Ref. Cell | Ref. Cell Current | Net Ref. Current |
|---|---|---|---|---|---|
| BLr1 | 1.15 × (W0/L0) | 1.15 × IN | 01 (lowest) | −1.0 × IN | 0.15 × IN |
| BLr2 | 1.15 × (W0/L0) | 1.15 × IN | 11 | −0.7 × IN | 0.45 × IN |
| BLr3 | 1.15 × (W0/L0) | 1.15 × IN | 10 | −0.4 × IN | 0.75 × IN |

In yet another configuration of the third embodiment of memory array 1200, two reference cells (e.g. 115-1 and 115-2) can be programmed to the same Vt state. For the pair of reference cells having the same programmed state, the pull-up device corresponding to one reference cell is smaller than pull-up devices 1220 and 1230, and the pull-up device corresponding to the other reference cell is larger than pull-up devices 1220 and 1230. The two reference cells with their associated pull-up devices thus generate bit line reference currents that are respectively smaller and larger than the bit line current generated when the selected memory cell has the same threshold voltage state as the reference cells.

Figure 13:
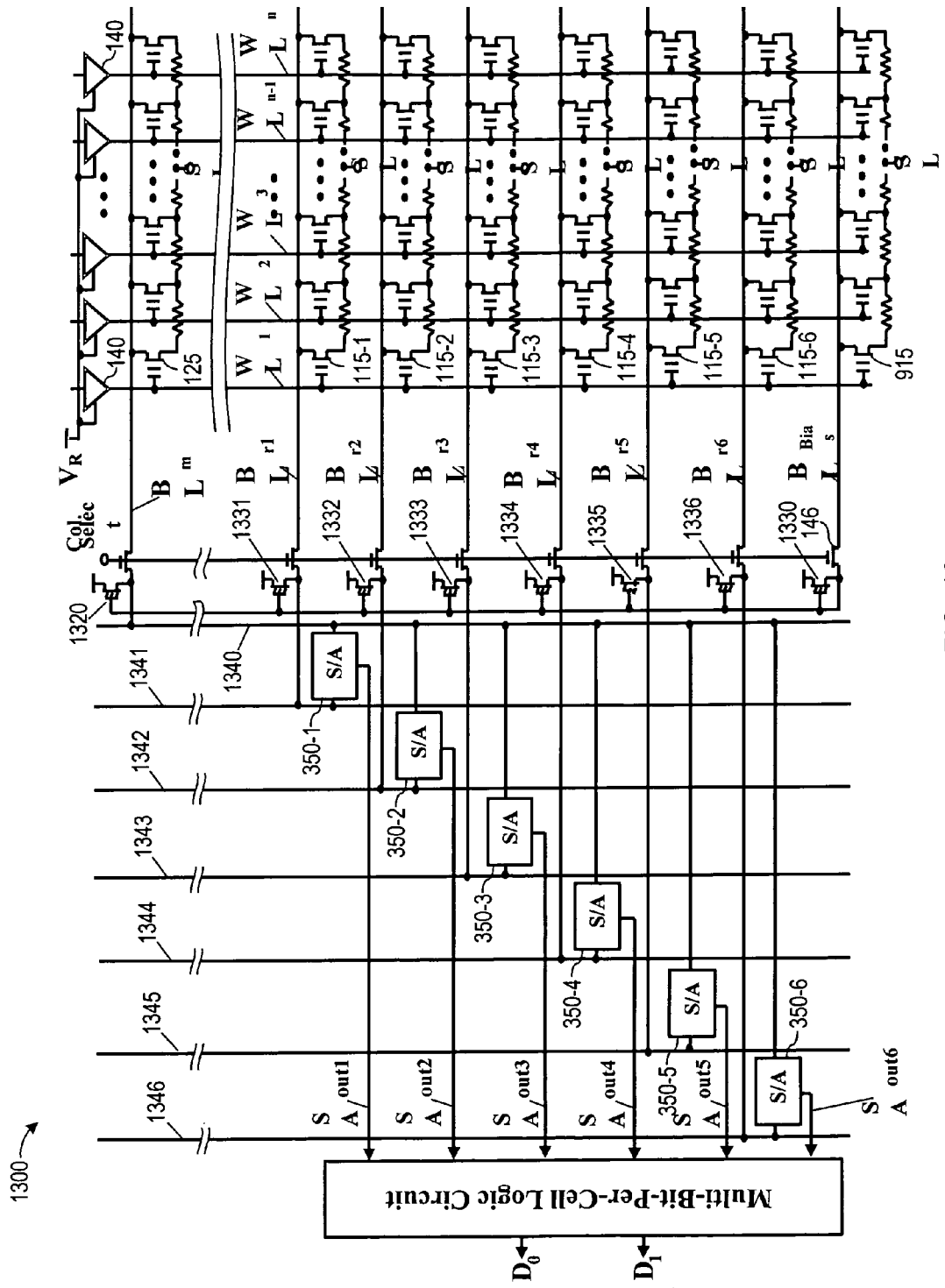
FIG. 13 illustrates another multi-level or multiple-bit-per-cell memory using reference circuits in accordance with an embodiment of the invention.

FIG. 13 illustrates a 2-bit-per-cell memory array 1300 employing six reference bit lines BLr1 to BLr6 and a bias bit line BLbias to generate six reference currents. Reference bit lines BLr1 to BLr6 or corresponding reference I/O lines 1341 to 1346 have respective pull-up devices 1331 to 1336 that are sized relative to pull-up device 1320 for normal bit line BL and bias bit line BLbias as required to provide bit line reference currents at the desired levels. The effective size of pull-up devices 1330 to 1336 can be fixed or dynamically adjustable after testing or during the life of the memory 1300. Table 5 illustrates an exemplary configuration of the sizes of pull-up devices 1331 to 1336 for memory array 1300 when pull-up devices 1320 and 1330 have the same size W0/L0 and memory cells 125 have the same properties as described for Tables 2.

TABLE 5

| Ref. Bit Line | Pull-up Device Size | Pull-Up Current | Vt State of Ref. Cell | Ref. Cell Current | Net Ref. Current |
| --- | --- | --- | --- | --- | --- |
| BLr1 | 1.15 × (W0/L0) | 1.15 × IN | 01 (lowest) | −1.0 × IN | 0.15 × IN |
| BLr2 | 0.85 × (W0/L0) | 0.85 × IN | 11 | −0.7 × IN | 0.15 × IN |
| BLr3 | 1.15 × (W0/L0) | 1.15 × IN | 11 | −0.7 × IN | 0.45 × IN |
| BLr4 | 0.85 × (W0/L0) | 0.85 × IN | 10 | −0.4 × IN | 0.45 × IN |
| BLr5 | 1.15 × (W0/L0) | 1.15 × IN | 10 | −0.4 × IN | 0.75 × IN |
| BLr6 | 0.85 × (W0/L0) | 0.85 × IN | 00 (highest) | −0.1 × IN | 0.75 × IN |

Memory array 1300 requires more reference lines than does memory array 1200 of FIG. 12, and under ideal circumstances, memory array 1300 when configured as shown in Table 5 generates redundant reference signals that are nominally the same. An advantage of the embodiment of Table 5 is that at least one reference cell 115 that is being used in sensing is programmed to the same threshold voltage state as the memory cell 125 being read, and that reference may provide the best tracking of variations of the memory cell. Further, differences in bit line reference currents that are nominally the equal (e.g., bit line reference currents on reference bit lines BLr5 and BLr6) may develop as the threshold voltages of programmed memory and reference cells change. These differences may be directly sensed using additional circuitry (not shown) or may be detected during reading, for example, if a read operation causes sense amplifier 350-6 to trip but does not trip sense amplifier 350-5. A detecting difference in the nominally equal reference signals could indicate a drift in the programmed threshold voltages, signaling a data error or the need to refresh stored data.

In an alternative configuration of memory array, the sizes of the pull-up devices 1331 to 1336 can be adjusted so that the reference currents instead of being redundant define separate bands corresponding to target threshold voltage level. Table 6 shows one such configuration.

TABLE 6

| Ref. Bit Line | Pull-up Device Size | Pull-Up Current | Vt State of Ref. Cell | Ref. Cell Current | Net Ref. Current |
| --- | --- | --- | --- | --- | --- |
| BLr1 | 1.1 × (W0/L0) | 1.1 × IN | 01 (lowest) | −1.0 × IN | 0.1 × IN |
| BLr2 | 0.9 × (W0/L0) | 0.9 × IN | 11 | −0.7 × IN | 0.2 × IN |

TABLE 6-continued

| Ref. Bit Line | Pull-up Device Size | Pull-Up Current | Vt State of Ref. Cell | Ref. Cell Current | Net Ref. Current |
| --- | --- | --- | --- | --- | --- |
| BLr3 | 1.1 × (W0/L0) | 1.1 × IN | 11 | −0.7 × IN | 0.4 × IN |
| BLr4 | 0.9 × (W0/L0) | 0.9 × IN | 10 | −0.4 × IN | 0.5 × IN |
| BLr5 | 1.1 × (W0/L0) | 1.1 × IN | 10 | −0.4 × IN | 0.7 × IN |
| BLr6 | 0.9 × (W0/L0) | 0.9 × IN | 00 (highest) | −0.1 × IN | 0.8 × IN |

With the configuration of Table 6, the bit line current for the selected memory cell 125 can be checked to determine if the stored data falls with one of four bands corresponding to the Vt levels for data. Using the illustrated threshold voltage states for storing data, a bit line current less that about 0.1×IN, which fails to trip any of the sense amplifiers 350-1 to 350-6, is in a first band corresponding data value 01. If only the sense amplifiers 350-1 and 350-2 connected to reference bit line sBLr1 and BLr2 trip, the bit line current is in a second band (which is between 0.2 and 0.4×IN) and corresponds to data value 11. If only sense amplifiers 350-1 to 350-4 connected to reference bit lines BLr1 to BLr4 trip, the bit line current is in a third band (which is between 0.5 and 0.7×IN) and corresponds data value 10. If all sense amplifiers 350-1 to 350-6 trip, the bit line current is greater than 0.8×IN and corresponds data value 10. A memory cell 125 providing a bit line current falling between the bands indicates a data error and can be detected when other combinations of the sense amplifiers 350-1 to 350-6 trip.

Memory arrays 1200 and 1300 provide examples of multiple-bit-per-cell memory architectures using bit line bias schemes in accordance with the invention. Other memory architectures employing bit lines and memory cells that represent data using differences in threshold voltages could also adopt the disclosed reference schemes. In particular, the bit line reference schemes could be applied in a contactless Flash memory array architecture. Also, other types of non-volatile memory devices, not limited to conventional Flash memory cells or polysilicon floating gate memory cells, can also employ such bit line referencing schemes. Memories using memory cells with nitride floating gates with isolated charge-trapping as data storage, P-channel Flash memory cells, EEPROM cells, and mask ROMs (to name a few examples) could also employ bit line referencing scheme in accordance with the invention.

The reference schemes as described here are also compatible with all types of sense amplifier circuits. Differential sense amplifiers, for example, primarily have two sub-categories, dynamic cross-coupled latch sense amplifiers (originally used in DRAM designs) and static differential CMOS sense amplifiers (originally used in SRAM designs). Any such sense amplifiers are suitable. For certain high-speed non-volatile memory designs, it is possible to combine single-ended and differential amplifiers to improve sensing speeds even further.

Although the invention has been described with reference to particular embodiments, the description is only an example of the invention's application and should not be taken as a limitation. For example, although the above descriptions describes the operation of N-channel memory devices that pull down bit lines and P-channel pull-up devices that pull up bit lines, the conductivity types and the functions as pulling up or down a bit line voltage can be changed for other embodiments of the invention. Various other adaptations and combinations of features of the embodiments disclosed are within the scope of the invention as defined by the following claims.

What is claimed is:

1. A memory comprising:
a bit line connected to a column of memory cells;
a first reference bit line connected to a column of reference cells;
a plurality of word lines, wherein each word line is coupled to control one of the memory cells and one of the reference cells;
a sense amplifier coupled to sense a difference between the bit line and the first reference bit line;
a bias bit line coupled to a column of reference cells, each reference cell coupled to the bias bit line being connected to a corresponding one of the word lines;
a first pull-up device coupled to the first reference bit line during a sensing operation;
a bias pull-up device coupled to the bias bit line during the sensing operation; and
a normal pull-up device coupled to the bit line during the sensing operation, wherein the first and normal pull-up devices are coupled to mirror a current through the bias pull-up device,
wherein the first pull-up device has a first effective size, and the normal pull-up device has an effective size that differs from the first effective size.

2. The memory of claim 1, wherein the first effective size is about one half of the effective size of the normal pull-up device.

3. The memory of claim 1, wherein the bias pull-up device has an effective size that is the same as the effective size of the normal pull-up device.

4. A memory comprising:
a bit line connected to a column of memory cells;
a first reference bit line connected to a column of reference cells;
a plurality of word lines, wherein each word line is coupled to control one of the memory cells and one of the reference cells;
a sense amplifier coupled to sense a difference between the bit line and the first reference bit line;
a bias bit line coupled to a column of reference cells, each reference cell coupled to the bias bit line being connected to a corresponding one of the word lines;
a first pull-up device coupled to the first reference bit line during a sensing operation;
a bias pull-up device coupled to the bias bit line during the sensing operation; and
a normal pull-up device coupled to the bit line during the sensing operation, wherein the first and normal pull-up devices are coupled to mirror a current through the bias pull-up device;
a second reference bit line coupled to a second column of reference cells, each reference cell in the second column being connected to a corresponding one of the word lines; and
a second pull-up device coupled to the second reference bit line, wherein the second pull-up device is coupled to mirror the current through the bias pull-up device.

5. The memory device of claim 4, wherein the main pull-up device has an effective size that differs from an effective size of the first pull-up device and from an effective size of the second pull-up device.

6. The memory of claim 5, wherein:
each of the memory cells stores a multi-bit value represented by the memory cell having one of a plurality of threshold voltage states; and
the reference cells in the first column are programmed to a first of the threshold voltage states.

7. The memory of claim 6, wherein:
the reference cells in the second column are programmed to the first of the threshold voltage states; and
the effective size of the first pull-up device differs from the effective size of the second pull-up device.

8. The memory of claim 7, wherein the effective size of the first pull-up device is smaller that the effective size of the normal pull-up device, and the effective size of the second pull-up device is larger than the effective size of the normal pull-up device.

9. The memory of claim 6, wherein the reference cells in the second column are programmed to a second of the threshold voltage states.

10. The memory of claim 9, wherein the effective size of the first pull-up device matches the effective size of the second pull-up device.

11. A multi-bit-per-cell memory comprising:
a bit line coupled to a column of memory cells;
a plurality of reference bit lines, each reference bit line being connected to a column of reference cells;
a plurality of sense amplifiers, wherein during a read operation reading a multi-bit value from a selected one of the memory cells coupled to the bit line, each sense amplifier is coupled to sense a difference between the bit line and a corresponding one of the reference bit lines;
a bias bit line coupled to a column of reference cells;
a normal pull-up device coupled to the bit line during the read operation;
a plurality of reference pull-up devices respectively coupled to the plurality of reference bit lines during the read operation; and
a bias pull-up device coupled to the bias bit line during the read operation, wherein the normal pull-up device and the reference pull-up devices are coupled to mirror a current through the bias pull-up device.

12. The memory of claim 11, wherein all of the reference devices coupled to the reference bit lines are programmed to the same threshold voltage state, and each of the reference pull-up devices has a different size.

13. The memory of claim 11, wherein:
the reference cells that are coupled to a first of the reference bit lines are programmed to a first threshold voltage state; and
the reference cells that are coupled to a second of the reference bit lines are programmed to a second threshold voltage state.

* * * * *